United States Patent [19]
Usui

[11] Patent Number: 5,926,061
[45] Date of Patent: Jul. 20, 1999

[54] POWER SUPPLY NOISE ELIMINATING METHOD AND SEMICONDUCTOR DEVICE

[75] Inventor: Yuzo Usui, Kawasaki, Japan

[73] Assignee: Fujitsu Limited, Kawasaki, Japan

[21] Appl. No.: 08/763,797

[22] Filed: Dec. 11, 1996

[30] Foreign Application Priority Data

Jul. 5, 1996 [JP] Japan ................................. 8-176853

[51] Int. Cl.$^6$ ..................................................... G05F 1/10
[52] U.S. Cl. ........................... 327/538; 327/565; 327/540; 327/551; 333/32
[58] Field of Search ...................................... 327/310, 311, 327/545, 551, 538, 540, 565; 333/32

[56] References Cited

U.S. PATENT DOCUMENTS

| | | | |
|---|---|---|---|
| 4,366,397 | 12/1982 | Kitamura et al. | 307/264 |
| 5,132,555 | 7/1992 | Takahashi | 307/296.1 |
| 5,578,960 | 11/1996 | Matsumura et al. | 327/535 |
| 5,663,677 | 9/1997 | Freyman et al. | 327/565 |

FOREIGN PATENT DOCUMENTS 42 25 617 C2  3/1993  Germany .

OTHER PUBLICATIONS

Brandt, H.–J..: HF–Empfindlichkeit stabilisierter Netzgeräte; in: cq–DL 3/91 (1991), S. 165 no month.

Margieh. U., Paul, R.: Störe meine OpAmps nicht, in.: ELRAD 1994, H. 8 (1994), Seiten 43–45 no month.

Deutsches Patentamt Mar. 6, 1998.

Primary Examiner—Timothy P. Callahan
Assistant Examiner—Jung Ho Kim
Attorney, Agent, or Firm—Staas & Halsey

[57] ABSTRACT

A power supply noise eliminating method eliminates power supply noise in a semiconductor integrated circuit having a plurality of first terminals coupled to a first power supply voltage and one or a plurality of second terminals coupled to a second power supply voltage which is different from the first power supply voltage. The power supply noise eliminating method includes the steps of (a) supplying the first power supply voltage to one of the first terminals, and (b) supplying the second power supply voltage to another one of the first terminals via an impedance circuit, thereby eliminating the power supply noise with respect to at least the first power supply voltage.

15 Claims, 13 Drawing Sheets

POWER SUPPLY NOISE ELIMINATING METHOD AND SEMICONDUCTOR DEVICE

BACKGROUND OF THE INVENTION

The present invention generally relates to power supply noise eliminating methods and semiconductor devices, and more particularly to a power supply noise eliminating method for eliminating power supply noise of a semiconductor integrated circuit which carries out a high-speed operation, and to a semiconductor device which uses such a power supply noise eliminating method.

In this specification, the "power supply noise" includes ground noise.

Semiconductor integrated circuits are used in systems with respect to which there are demands to realize high-speed operation and high performance. For this reason, there are demands to further increase the operation speed and to increase the number of terminals of the semiconductor integrated circuits. However, in order to cope with such demands requiring high-speed operation and large number of terminals of the semiconductor integrated circuit, a signal varying speed dI/dt and a number N of varying signals both become large, and power supply noise which is proportional to N·dI/dt is generated at a power supply or ground. This power supply noise is also proportional to an inductance of the terminals connecting the inside and the outside of the semiconductor integrated circuit. Accordingly, in general, the length of the terminals is made short and the terminals are coupled in parallel, so as to reduce the power supply noise by reducing the inductance of the terminals.

The number N of varying signals tends to increase considerably as the bus width of the system using the semiconductor integrated circuit increases from 8 bits to 16 bits, from 16 bits to 32 bits, and from 32 bits to 64 bits, for example. In addition, the signal varying speed dI/dt also increases considerably from several ns to 1 ns or less. For this reason, the value of N·dI/dt has become several tens times larger in recent years, and the power supply noise had a tendency of increasing therewith.

Power supply terminals, including ground terminals, of the semiconductor integrated circuit have an inductance on the order of several nH, and the power supply noise is generated by a rapid change in the current. In order to reduce this power supply noise, n power supply terminals are provided, where n is an integer greater than 1, so as to reduce the power supply noise to 1/n.

FIG. 1 is a circuit diagram showing an equivalent circuit of a power supply part of the semiconductor integrated circuit. As may be seen from FIG. 1, when n terminals are provided, an inductance L is reduced to 1/n or, a current deviation dI/dt of a current $_Ai$ is reduced to 1/n, thereby reducing a voltage Vn=L·dI/dt which corresponds to the power supply noise to 1/n. In FIG. 1, Vcc denotes a power supply voltage.

However, an equivalent circuit of the actual semiconductor integrated circuit having a semiconductor chip is as shown in FIG. 2. In FIG. 2, R denotes a resistance with respect to a D.C. current which flows regularly, and C denotes a static capacitance of the semiconductor chip viewed from the power supply terminal. Accordingly, the equivalent circuit shown in FIG. 2 has a construction shown in FIG. 3 when viewed from a current source of the current $_Ai$.

An impedance Z of a parallel resonant circuit made up of the inductance L, the resistance R and the static capacitance C shown in FIG. 3 can be described by the following formula.

$$Z = x + jy$$

$$= 1/\{1/j\omega L) + (1/R) + j\omega C\}$$

The following formula can be obtained by eliminating ω from the above formula.

$$\{x-(1/2)R\}^2 + y^2 + \{(1/2)R)\}^2$$

When this formula is illustrated, a complex plane representation shown in FIG. 4 is obtained. In FIG. 4, the ordinate indicates the imaginary number, and the abscissa indicates the real number. For example, the resistance R is 50 Ω, the inductance L is 2 nH, and the static capacitance C is 100 pF.

When FIG. 4 is illustrated in a ω-plane, a ω-plane representation shown in FIG. 5 is obtained. In FIG. 5, the ordinate indicates the amplitude, and the abscissa indicates the frequency. In addition, in FIG. 5, a solid line indicates the real number portion, and a dotted line indicates the imaginary number portion. A parallel resonance of the parallel resonant circuit occurs at a frequency $\omega p = 1/\sqrt{LC}$, and an impedance corresponding to the D.C. current can be seen when viewed from the current varying point. As may be seen from FIG. 5, the impedance sharply assumes a large value at the parallel resonance frequency ωp. In this example, the impedance has a peak, that is, the parallel resonance point occurs, at a position where the impedance is approximately 50 Ω.

Accordingly, the current deviation dI/dt as it is becomes the power supply voltage deviation. For example, if the current deviation dI/dt is 5 mA when the D.C. power supply current $_Ai$ is 50 mA, a power supply voltage deviation Vn which is 1/10 the power supply voltage Vcc occurs at the parallel resonance frequency ωp of the parallel resonant circuit.

Conventionally, the power supply noise which occurs at the power supply or the ground and is proportional to N·dI/dt was reduced by reducing the inductance of the terminals connecting the inside and the outside of the semiconductor integrated circuit. However, a certain distance is inevitably required to connect the inside and the outside of the semiconductor integrated circuit, and there was a limit to increasing the number of terminals. For this reason, the inductance of the terminals does not become zero even if the length of the terminals is reduced within the possible range and the number of terminals is increased within the possible range, and there was a problem in that it was impossible to considerably improve the effect of reducing the power supply noise.

On the other hand, when viewed from the power supply terminals, the semiconductor integrated circuit has a static capacitance, and a parallel resonant circuit is formed by this static capacitance and the inductance of the power supply terminals when the current varies. As a result, the impedance becomes infinitely large at the parallel resonance frequency of the parallel resonant circuit, and there was a problem in that ringing noise is generated thereby. In addition, even if the inductance of the terminals is reduced, this would only increase the parallel resonance frequency of the parallel resonant circuit, and the parallel resonance point will not be eliminated. Hence, reducing the inductance of the terminals will not solve the problem of the ringing noise.

SUMMARY OF THE INVENTION

Accordingly, it is a general object of the present invention to provide a novel and useful power supply noise eliminating method and semiconductor device, in which the problems described above are eliminated.

Another and more specific object of the present invention is to provide a power supply noise eliminating method which eliminates power supply noise of a semiconductor integrated circuit and also prevent ringing noise, and to a semiconductor device which employs such a power supply noise eliminating method.

Still another object of the present invention is to provide a power supply noise eliminating method which eliminates power supply noise in a semiconductor integrated circuit having a plurality of first terminals coupled to a first power supply voltage and one or a plurality of second terminals coupled to a second power supply voltage which is different from the first power supply voltage, comprising the steps of (a) supplying the first power supply voltage to one of the first terminals, and (b) supplying the second power supply voltage to another one of the first terminals via an impedance circuit, thereby eliminating the power supply noise with respect to at least the first power supply voltage. According to the power supply noise eliminating method of the present invention, it is possible to effectively reduce the power supply noise of the semiconductor integrated circuit using a simple circuit construction, and also prevent generation of ringing noise.

A further object of the present invention is to provide a semiconductor device comprising a semiconductor integrated circuit having a plurality of first terminals for receiving a first power supply voltage and one or a plurality of second terminals for receiving a second power supply voltage different from the first power supply voltage, and an impedance circuit coupled between one of the first terminals and the second power supply voltage, so that power supply noise with respect to at least the first power supply voltage is eliminated. According to the semiconductor device of the present invention, it is possible to effectively reduce the power supply noise of the semiconductor integrated circuit using a simple circuit construction, and also prevent generation of ringing noise.

Other objects and further features of the present invention will be apparent from the following detailed description when read in conjunction with the accompanying drawings.

DESCRIPTION OF THE PREFERRED EMBODIMENTS

First, a description will be given of the operating principle of a semiconductor device according to the present invention employing a power supply noise eliminating method according to the present invention, by referring to FIG. 6.

Figure 1:
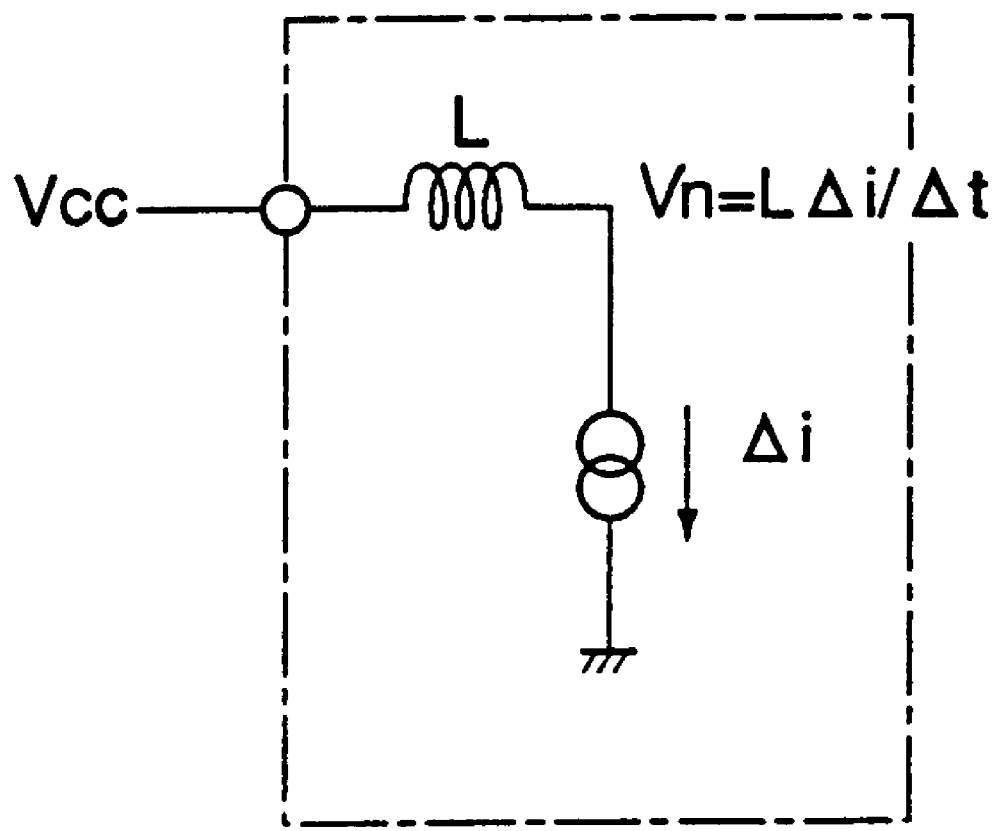
FIG. 1 is a circuit diagram showing an equivalent circuit of a power supply part of a semiconductor integrated circuit.
Figure 2:
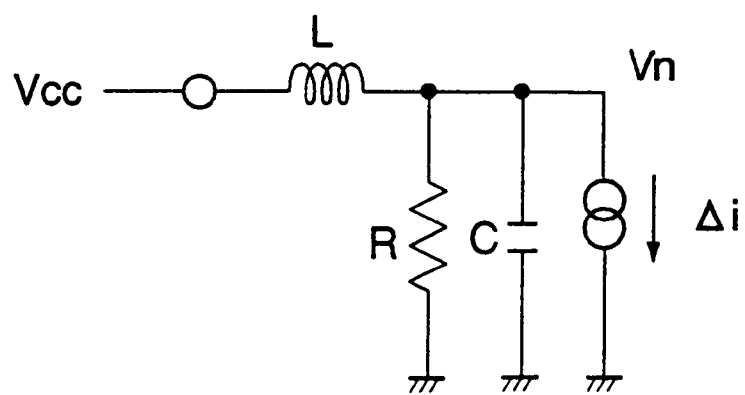
FIG. 2 is a circuit diagram showing an equivalent circuit of an actual semiconductor integrated circuit having a semiconductor chip.
Figure 3:
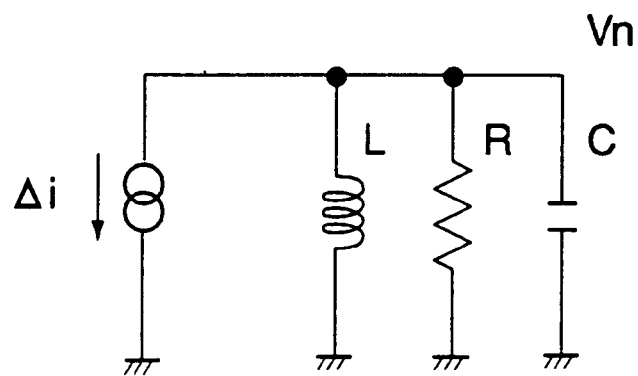
FIG. 3 is a circuit diagram showing an equivalent circuit of the circuit shown in FIG. 2 when viewed from a current source.
Figure 4:
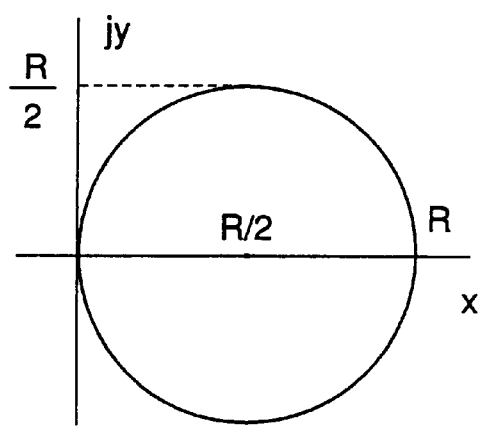
FIG. 4 is a diagram showing a complex plane representation of a formula which indicates an impedance of a parallel resonant circuit by eliminating ω from the formula.
Figure 5:
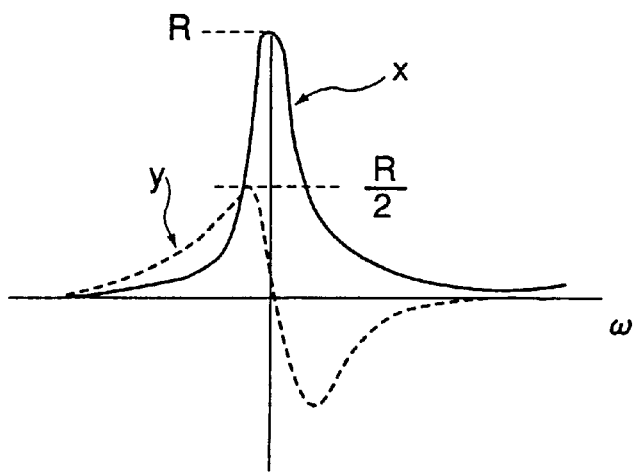
FIG. 5 is a diagram showing a ω-plane representation of FIG. 4 in a ω-plane.
Figure 6:
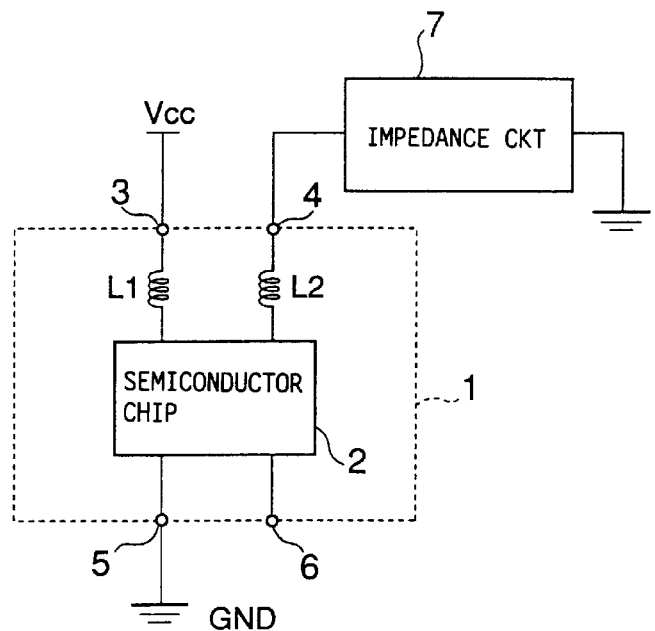
FIG. 6 is a system block diagram for explaining the operating principle of a semiconductor device according to the present invention employing a power supply noise eliminating method according to the present invention.

A semiconductor device shown in FIG. 6 includes a semiconductor integrated circuit 1, terminals 3 through 6, and an impedance circuit 7. The semiconductor integrated circuit 1 includes a semiconductor chip 2 and the terminals 3 through 6. L1 and L2 respectively denote inductances of the terminals 3 and 4. In FIG. 6, the illustration of the inductances of the terminals 5 and 6 is omitted. Of course, the number of terminals of the semiconductor integrated circuit 1 is not limited to 4.

The terminals 3 and 4 are power supply terminals for supplying a first power supply voltage to the semiconductor chip 2. In addition, the terminals 5 and 6 are power supply terminals for supplying a second power supply voltage to the semiconductor chip 2. For example, the first power supply voltage is Vcc, and the second power supply voltage is ground GND. The impedance circuit 7 is coupled between the terminal 4 and the second power supply voltage, for example. A circuit similar to the impedance circuit 7 and coupled between the terminal 5 or 6 and the first power supply voltage may be provided in place of or in addition to the impedance circuit 7. However, for the sake of convenience, it is assumed that only the impedance circuit 7 is provided.

When viewed from the power supply terminal 4, a parallel circuit is formed by the inductance L2 and the impedance circuit 7 which are coupled in parallel, but a synthesized impedance of the terminal 4 becomes zero at the resonance frequency of the impedance circuit 7. For this reason, it is possible to effectively eliminate the power supply noise.

On the other hand, when viewed from the power supply terminal 4 or the like, the semiconductor chip 2 has a static capacitance, and a parallel resonant circuit is formed by this static capacitance and the inductance of the power supply terminal 4 when the current varies. As a result, the impedance becomes infinitely large at a parallel resonance frequency of the parallel resonant circuit, and ringing noise would originally occur. However, in the present invention, the synthesized impedance of the power supply terminal 4 becomes zero at the resonance frequency of the impedance circuit 4. Accordingly, it is possible to prevent the generation of the ringing noise by appropriately selecting the parallel resonance frequency and the resonance frequency of the impedance circuit 7.

The construction of the semiconductor device is not limited to that shown in FIG. 6 wherein the impedance circuit 7 is provided externally to the semiconductor integrated circuit 1. The impedance circuit 7 may be provided within the semiconductor integrated circuit 1 or, the impedance circuit 7 may be provided within the semiconductor chip 2. When the semiconductor device is constructed such that the impedance circuit 7 is provided within the semiconductor integrated circuit 1, it is possible to provide a built-in power supply noise eliminating means within the semiconductor device, that is, within the semiconductor package.

The construction of the impedance circuit 7 is not limited to a specific construction, as long as the impedance circuit 7 includes at least one of capacitor, inductor and resistor.

Figure 7:
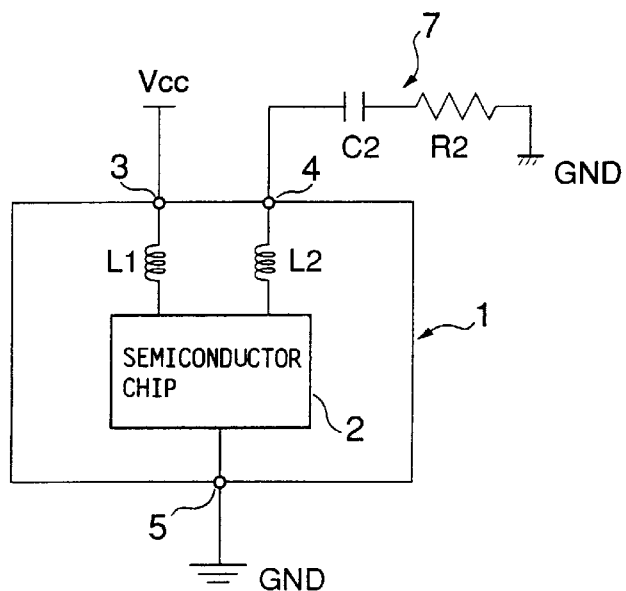
FIG. 7 is a circuit diagram showing a first embodiment of the semiconductor device according to the present invention.

FIG. 7 shows a first embodiment of the semiconductor device according to the present invention. This first embodiment of the semiconductor device employs a first embodiment of the power supply noise eliminating method according to the present invention. In FIG. 7, those parts which are the same as those corresponding parts in FIG. 6 are designated by the same reference numerals, and a description thereof will be omitted.

Figure 8:
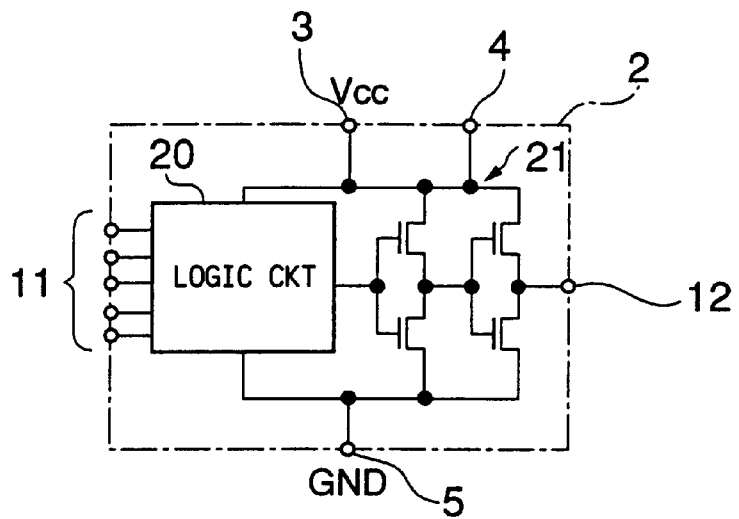
FIG. 8 is a circuit diagram showing the construction of a semiconductor chip.

In FIG. 7, the impedance circuit 7 is a series circuit including a capacitor C2 and a resistor R2 which are connected in series. In addition, the semiconductor chip 2 has a construction shown in FIG. 8. As shown in FIG. 8, the semiconductor chip 2 includes a logic circuit 20, an output circuit 21, the power supply terminals 3 through 5, an input terminal group 11, and an output terminal 12. Of course, the number of terminals is not limited to that shown in FIG. 8.

Figure 9:
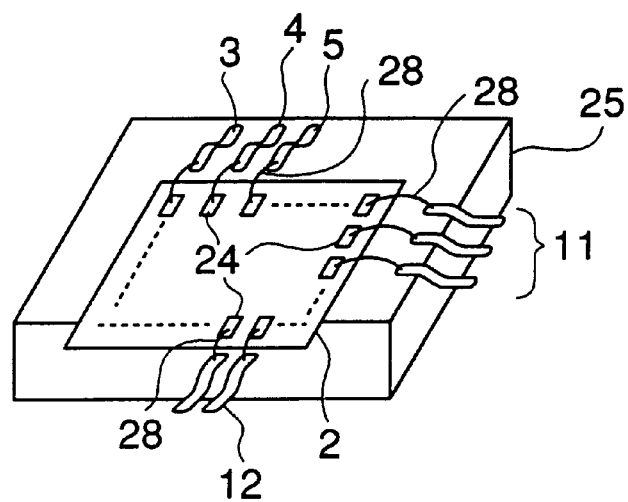
FIG. 9 is a perspective view showing a semiconductor chip portion.

FIG. 9 shows a perspective view of the semiconductor chip portion. In FIG. 9, the semiconductor chip 2 is provided on a substrate 25, and electrodes 24 of the semiconductor chip 2 are connected to the corresponding terminals 3 through 5, 11 and 12 via bonding wires 28. Hence, the inductance of each terminal includes the inductance of the corresponding bonding wire 28.

Figure 10:
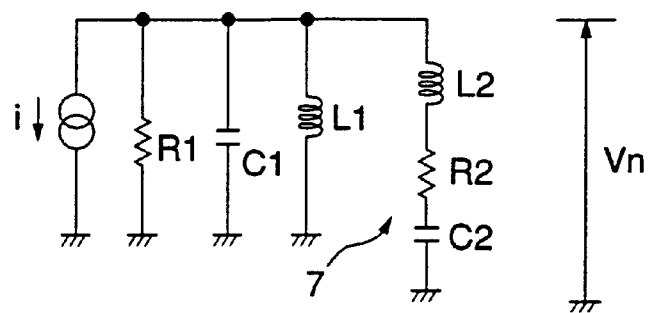
FIG. 10 is a circuit diagram showing an equivalent circuit of a semiconductor integrated circuit shown in FIG. 7.

An equivalent circuit of the semiconductor integrated circuit 1 shown in FIG. 7 becomes as shown in FIG. 10. In FIG. 10, R1 denotes a resistance with respect to the D.C. current which flows regularly, and C1 denotes a static capacitance of the semiconductor chip 2 when viewed from the power supply terminal.

In other words, between the two power supply terminals 3 and 4 for supplying the first power supply voltage to the semiconductor chip 2, this embodiment supplies the first power supply voltage Vcc from only the power supply terminal 3, and the other power supply terminal 4 is coupled to the second power supply voltage, that is, the ground GND, via the impedance circuit 7. Hence, it is possible to reduce the impedance of the power supply terminals 3 and 4 by cancelling the maximum value obtained by the parallel resonance by the minimum value obtained by the series resonance, so that the power supply noise is effectively reduced.

When the value of the inductance L1 shown in FIG. 7 is denoted by L, the resistance of the resistor R1 is denoted by R and the value of the static capacitance C1 is denoted by C, an impedance Z of the parallel resonant circuit made up of the inductance L1, the resistor R1 and the static capacitance C1 can be described by the following formula.

$$Z = x + jy$$
$$= 1/\{(1/j\omega L) + (1/R) + j\omega C\}$$

The following formula is obtained by eliminating $\omega$ from the above formula.

$$\{x - (1/2)R\}^2 + y^2 = \{(1/2)R\}^2$$

Figure 11:
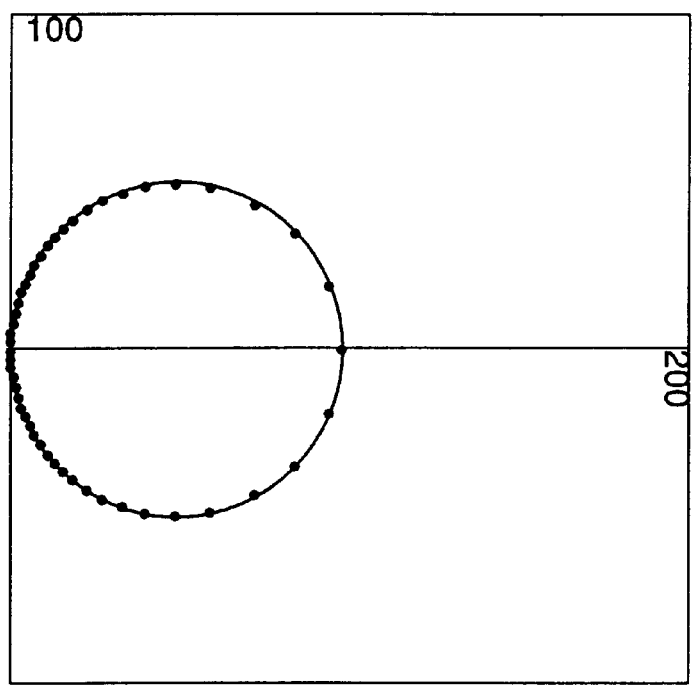
FIG. 11 is a diagram showing a complex plane representation of the first embodiment when a series resonance frequency due to an impedance circuit is selected to 10 times a parallel resonance frequency.
Figure 13:
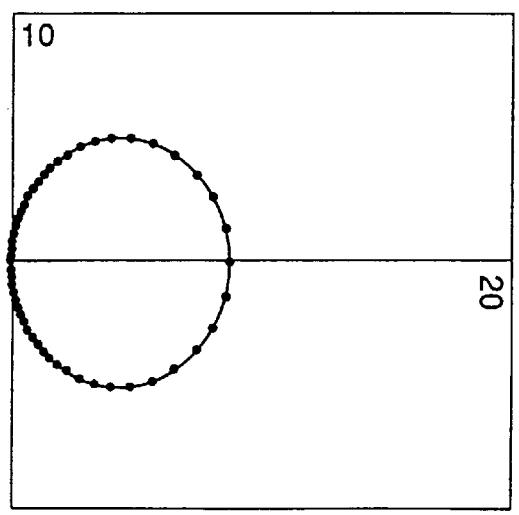
FIG. 13 is a diagram showing a complex plane representation of the first embodiment when the series resonance frequency due to the impedance circuit is selected equal to the parallel resonance frequency.
Figure 15:
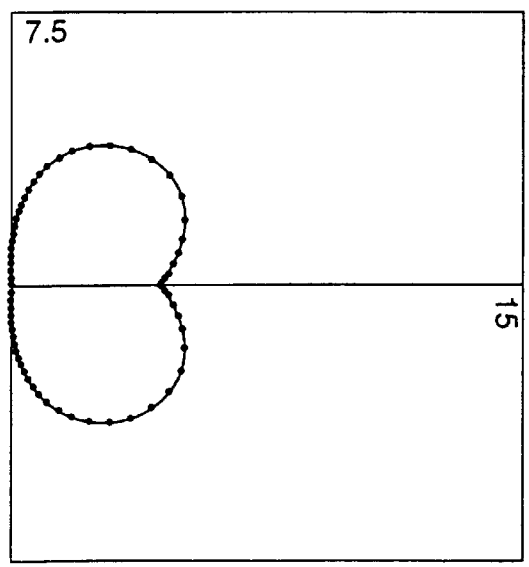
FIG. 15 is a diagram showing a complex plane representation of the first embodiment when the series resonance frequency due to the impedance circuit is selected equal to the parallel resonance frequency.

When this formula is illustrated, complex plane representations shown in FIGS. 11, 13 and 15 are obtained.

FIG. 11 shows the complex plane representation of this embodiment when the series resonance frequency $\omega s$ due to the impedance circuit 7 is selected to 10 times the parallel resonance frequency $\omega p$. In FIG. 11, the ordinate indicates the imaginary number, and the abscissa indicates the real number. For example, the resistor R1 is 100 Ω, the resistor R2 is 10 Ω, the inductances L1 and L2 are both 2 nH, the static capacitance C1 is 100 pF, and the capacitor C2 is 1 pF.

Figure 12:
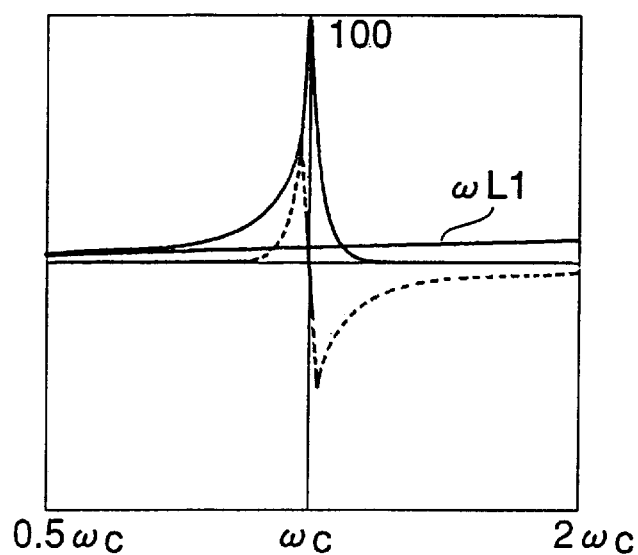
FIG. 12 is a diagram showing a ω-plane representation of FIG. 11 in a ω-plane.

When FIG. 11 is illustrated in a $\omega$-plane, a $\omega$-plane representation shown in FIG. 12 is obtained. In FIG. 12, the ordinate indicates the amplitude, and the abscissa indicates the frequency. In addition, in FIG. 12, a solid line indicates the real number portion, and a dotted line indicates the imaginary number portion. The parallel resonance of the parallel resonant circuit occurs at the frequency $\omega p = 1/\sqrt{L1C1}$, and the impedance corresponding to the D.C. current can be seen when viewed from the current varying point. As may be seen from FIG. 12, the impedance sharply assumes a large value at the parallel resonance frequency $\omega p$. In this particular case, the impedance has a peak, that is, the parallel resonance point occurs, at a position where the impedance is approximately 100 Ω.

FIG. 13 shows a complex plane representation of this embodiment when the series resonance frequency $\omega s$ due to the impedance circuit 7 is selected equal to the parallel resonance frequency $\omega p$. In FIG. 13, the ordinate indicates the imaginary number, and the abscissa indicates the real number. In this case, the resistor R1 is 100 n, the resistor R2 is 10 Ω, the inductances L1 and L2 are both 2 nH, the static capacitance C1 is 100 pF, and the capacitor C2 is 100 pF.

Figure 14:
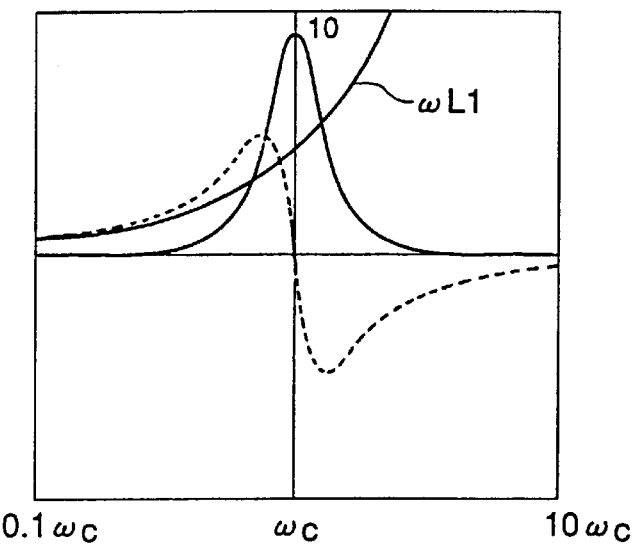
FIG. 14 is a diagram showing a ω-plane representation of FIG. 13 in a ω-plane.

When FIG. 13 is illustrated in a $\omega$-plane, a $\omega$-plane representation shown in FIG. 14 is obtained. In FIG. 14, the ordinate indicates the amplitude, and the abscissa indicates the frequency. In addition, in FIG. 14, a solid line indicates the real number portion, and a dotted line indicates the imaginary number portion. As may be seen from FIG. 14, the impedance gradually assumes a large value at the parallel resonance frequency ωp. In this particular case, the impedance has a peak, that is, the parallel resonance point occurs, at a position where the impedance is approximately 10 Ω.

FIG. 15 shows a complex plane representation of this embodiment when the series resonance frequency ωs due to the impedance circuit 7 is selected equal to the parallel resonance frequency ωp. In FIG. 15, the ordinate indicates the imaginary number, and the abscissa indicates the real number. In this case, the resistor R1 is 50 Ω, the resistor R2 is 5 Ω, the inductances L1 and L2 are both 2 nH, the static capacitance C1 is 100 pF, and the capacitor C2 is 100 pF.

Figure 16:
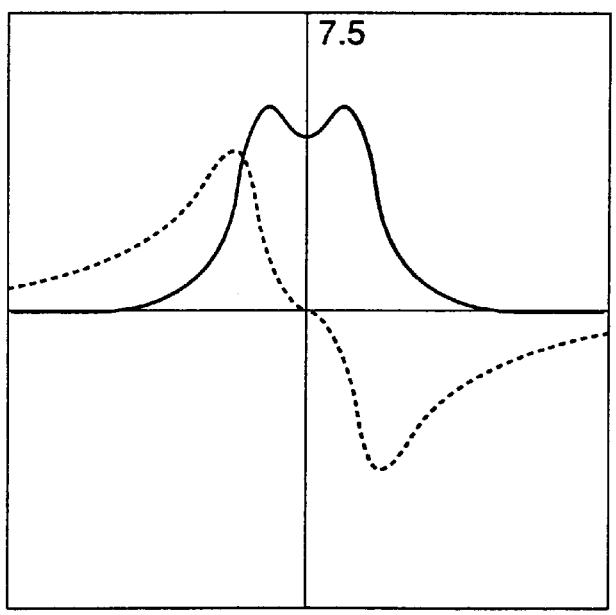
FIG. 16 is a diagram showing a ω-plane representation of FIG. 15 in a ω-plane.

When FIG. 15 is illustrated in a ω-plane, a ω-plane representation shown in FIG. 16 is obtained. In FIG. 16, the ordinate indicates the amplitude, and the abscissa indicates the frequency. In addition, in FIG. 16, a solid line indicates the real number portion, and a dotted line indicates the imaginary number portion. As may be seen from FIG. 16, the impedance gradually assumes a large value at the parallel resonance frequency ωp. In this particular case, the impedance has a peak, that is, the parallel resonance point occurs, at a position where the impedance is approximately 5 Ω.

When the relationships $\omega = \omega_o(1+\zeta)$, $\omega_o = 1\sqrt{LC}$ and $Q = R/\omega_o L$ stand in a vicinity of the parallel resonance frequency ωp, x and y can be calculated as follows.

$$x + jy = 1/[(1/R) + j\{\omega c - (1/\omega L)\}]$$

$$= 1/\left[(1/R) + j\{(1/\sqrt{LC})(1+\xi)C - (\sqrt{LC})/(L(1+\xi))\}\right]$$

$$= 1/\left[(1/R) + j(\sqrt{C/L})(1 + \xi - \{1/1 + \xi\})\right]$$

$$= R/\left[1 + j(\sqrt{C/L})R\{1 + \xi - (1/(1+\xi))\}\right]$$

Since $$\sqrt{(C/L)}\,R = \sqrt{(C/L)} \cdot \omega_o LQ$$

$$= \sqrt{(C/L)} \cdot (1/\sqrt{LC})LQ$$

$$= Q$$

and $$1+\zeta - \{1/(1+\zeta)\} \cong 1+\zeta - (1-\zeta) = 2\zeta$$

the following formula stands.

$$x + jy = 1/[1 + j2Q\zeta]$$

$$= (1 - j2Q\zeta)/\{1 + (2Q\zeta)^2\}$$

Accordingly, x and y can be obtained as follows.

$$x = R/[1 + (2Q\zeta)^2]$$

$$y = -2Q\zeta/[1 + (2Q\zeta)^2]R$$

Figure 17:
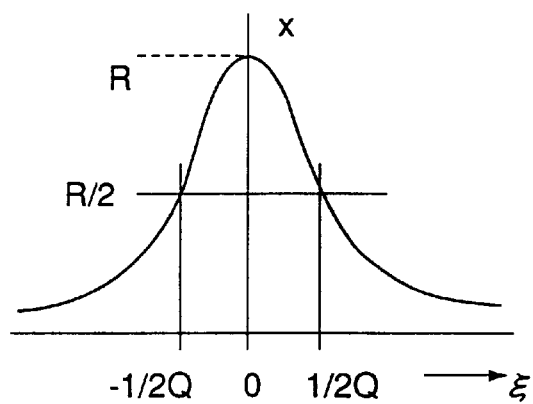
FIG. 17 is a diagram showing x with respect to a ζ-axis.
Figure 18:
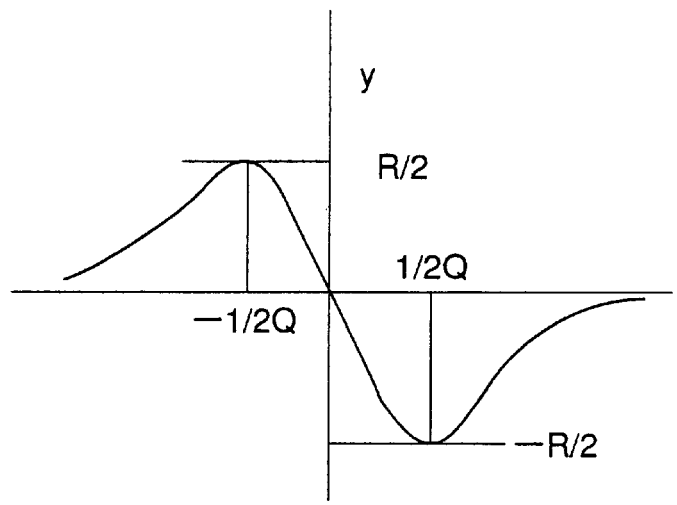
FIG. 18 is a diagram showing y with respect to the ζ-axis.

FIG. 17 shows x which is obtained from the above formula with respect to the ζ-axis. Similarly, FIG. 18 shows y which is obtained from the above formula with respect to the ζ-axis.

A solution by Laplace transform is obtained as follows.

$$Z = 1/[(1/SL) + (1/R) + SC]$$

$$= (1/C)[S/\{S^2 + (1/CR)S + (1/LC)\}]$$

-continued
$$= (1/C)/[S/\{(S + (1/2CR))^2 + (1/LC) - (1/2CR)^2\}]$$

Since $$(1/LC) - (1/2CR)^2 = (1/LC)\{1 - (LC)/4C^2R^2)\}$$

$$= (1LC)\{1 - L/(4CR^2)\}$$

and $$(C/L)R^2 = Q^2$$

the following formula can be obtained.

$$(1/LC)\{1 - L/(4CR^2)\} = (1/LC)[1 - \{1/(2Q)\}^2]$$

$$= \omega_o^2[1 - \{1/(2W)\}^2]$$

Accordingly, Z can be obtained from the following simplified formula.

$$Z = (1/C)[S/[\{S + (1/2CR)\}^2 + \{1 - (1/2Q)^2\}\omega_o^2]]$$

A step response can be obtained from the following formula when $I = I_o/S$.

$$V = Z \cdot I$$

$$= (I_o/C)[1/[\{S + (1/2CR)\}^2 + \{1 - (1/2Q)^2\}\omega_o^2]]$$

The power supply noise Vn can be obtained from the following formula because $(1/\omega C) = \omega_o L$.

$$V_n = \left[I_o / \left\{\omega_o C \sqrt{1 - (1/2Q)^2}\right\}\right] \cdot e^{-(1/2CR)t} \cdot$$

$$\sin\sqrt{1 - (1/2Q)^2} \cdot \omega_o t$$

$$= \left[(\omega_o L \cdot I_o) / \left\{\sqrt{1 - (1/2Q)^2}\right\}\right] \cdot e^{-(1/2CR)t} \cdot$$

$$\sin\sqrt{1 - (1/2Q)^2} \cdot \omega_o t$$

Figure 19:
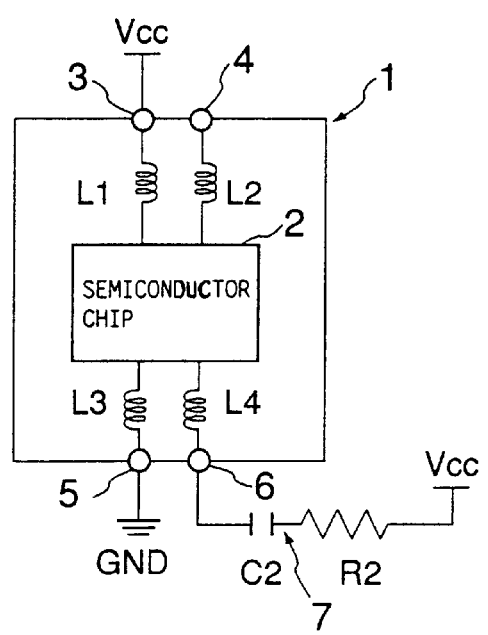
FIG. 19 is a circuit diagram showing a second embodiment of the semiconductor device according to the present invention.

Next, a description will be given of a second embodiment of the semiconductor device according to the present invention which employs a second embodiment of the power supply noise eliminating method according to the present invention. FIG. 19 shows the second embodiment of the semiconductor device. In FIG. 19, those parts which are the same as those corresponding parts in FIG. 7 are designated by the same reference numerals, and a description thereof will be omitted. In FIG. 19, L3 and L4 respectively denote inductances of the power supply terminals 5 and 6.

Between the two power supply terminals 5 and 6 for supplying the second power supply voltage to the semiconductor chip 2, this embodiment connects only the power supply terminal 5 to the second power supply voltage, that is, the ground GND, and the other power supply terminal 6 is coupled to the first power supply voltage Vcc via the impedance circuit 7. Hence, it is possible to reduce the impedance of the power supply terminals 5 and 6 by cancelling the maximum value obtained by the parallel resonance by the minimum value obtained by the series resonance, so that the power supply noise is effectively reduced.

Figure 20:
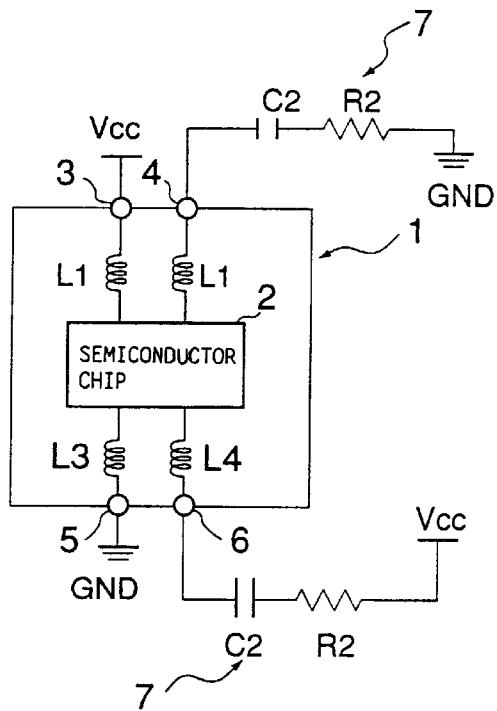
FIG. 20 is a circuit diagram showing a third embodiment of the semiconductor device according to the present invention.

Next, a description will be given of a third embodiment of the semiconductor device according to the present invention which employs a third embodiment of the power supply noise eliminating method according to the present invention. FIG. 20 shows the third embodiment of the semiconductor device. In FIG. 20, those parts which are the same as those corresponding parts in FIGS. 7 and 19 are designated by the same reference numerals, and a description thereof will be omitted.

In this embodiment, the impedance circuit 7 is provided independently with respect to the power supply terminals 4 and 6. As a result, it is possible to effectively reduce the power supply noise with respect to the first power supply voltage Vcc and also effectively reduce the ground noise with respect to the second power supply voltage GND.

Figure 21:
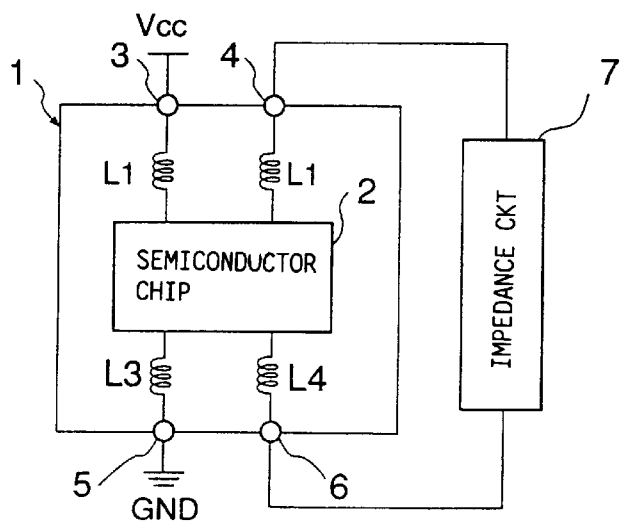
FIG. 21 is a circuit diagram showing a fourth embodiment of the semiconductor device according to the present invention.

Next, a description will be given of a fourth embodiment of the semiconductor device according to the present invention which employs a fourth embodiment of the power supply noise eliminating method according to the present invention. FIG. 21 shows the fourth embodiment of the semiconductor device. In FIG. 21, those parts which are the same as those corresponding parts in FIG. 20 are designated by the same reference numerals, and a description thereof will be omitted.

In this embodiment, between the two power supply terminals 3 and 4 for supplying the first power supply voltage to the semiconductor chip 2, only the power supply terminal 3 is connected to the first power supply voltage Vcc, and the other power supply terminal 4 is coupled to the power supply terminal 6 via the impedance circuit 7. The power supply terminal 5 is connected to the second power supply voltage, that is, the ground GND. Hence, it is possible to reduce the impedance of the power supply terminals 3 through 6 by cancelling the maximum value obtained by the parallel resonance by the minimum value obtained by the series resonance, so that the power supply noise is effectively reduced with respect to both the power supply voltage Vcc and the ground GND.

Figure 22:
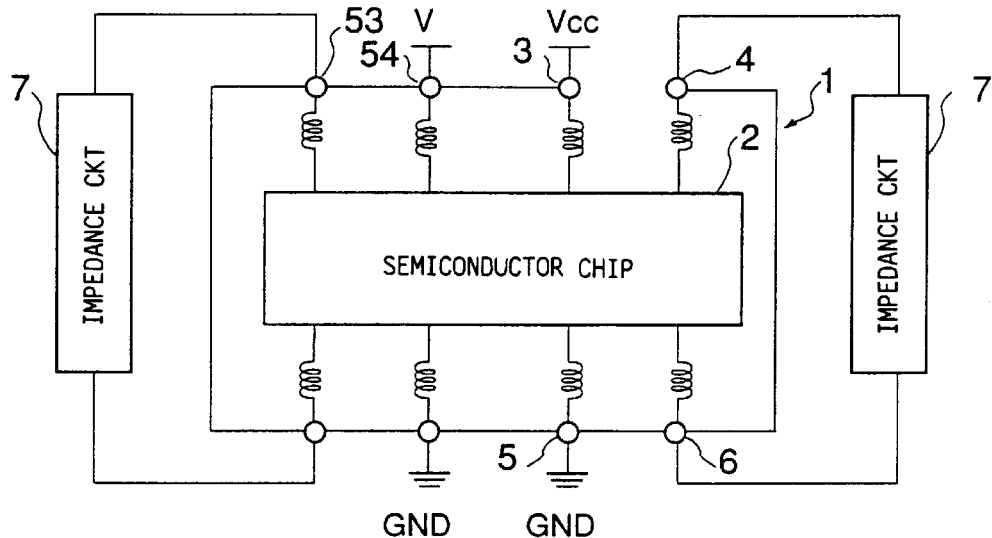
FIG. 22 is a circuit diagram showing a fifth embodiment of the semiconductor device according to the present invention.
Figure 23:
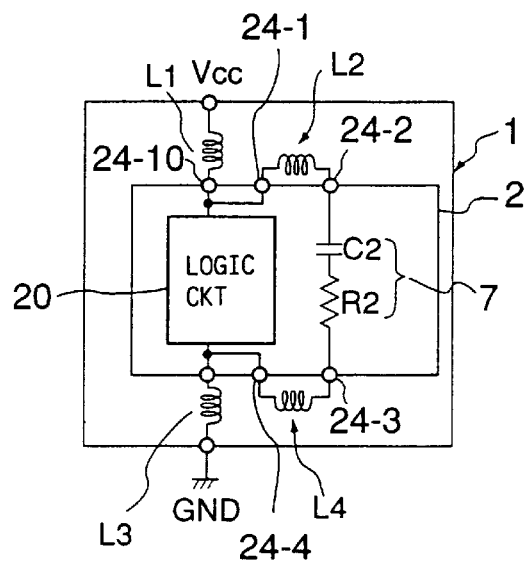
FIG. 23 is a circuit diagram showing a sixth embodiment of the semiconductor device according to the present invention.

Next, a description will be given of a fifth embodiment of the semiconductor device according to the present invention which employs a fifth embodiment of the power supply noise eliminating method according to the present invention. FIG. 22 shows the fifth embodiment of the semiconductor device. In FIG. 22, those parts which are the same as those corresponding parts in FIG. 21 are designated by the same reference numerals, and a description thereof will be omitted.

In this embodiment, between the two power supply terminals 3 and 4 for supplying the first power supply voltage to the semiconductor chip 2, only the power supply terminal 3 is connected to the first power supply voltage Vcc, and the other power supply terminal 4 is coupled to the power supply terminal 6 via the impedance circuit 7. The power supply terminal 5 is connected to the second power supply voltage, that is, the ground GND. Hence, it is possible to reduce the impedance of the power supply terminals 3 through 6 by cancelling the maximum value obtained by the parallel resonance by the minimum value obtained by the series resonance, so that the power supply noise is effectively reduced with respect to both the first power supply voltage Vcc and the ground GND.

Furthermore, between two power supply terminals 53 and 54 for supplying a third power supply voltage to the semiconductor chip 2, only the power supply terminal 53 is connected to the third power supply voltage V, and the other power supply terminal 54 is coupled to a power supply terminal 56 via the impedance circuit 7. A power supply terminal 55 is connected to the second power supply voltage, that is, the ground GND. Hence, it is possible to reduce the impedance of the power supply terminals 53 through 56 by cancelling the maximum value obtained by the parallel resonance by the minimum value obtained by the series resonance, so that the power supply noise is effectively reduced with respect to both the third power supply voltage V and the ground GND.

In each of the embodiments described above, one or more impedance circuits 7 are provided externally with respect to the semiconductor integrated circuit 1. However, each impedance circuit 7 may be provided within the semiconductor integrated circuit 1 or within the semiconductor chip 2.

Figure 24:
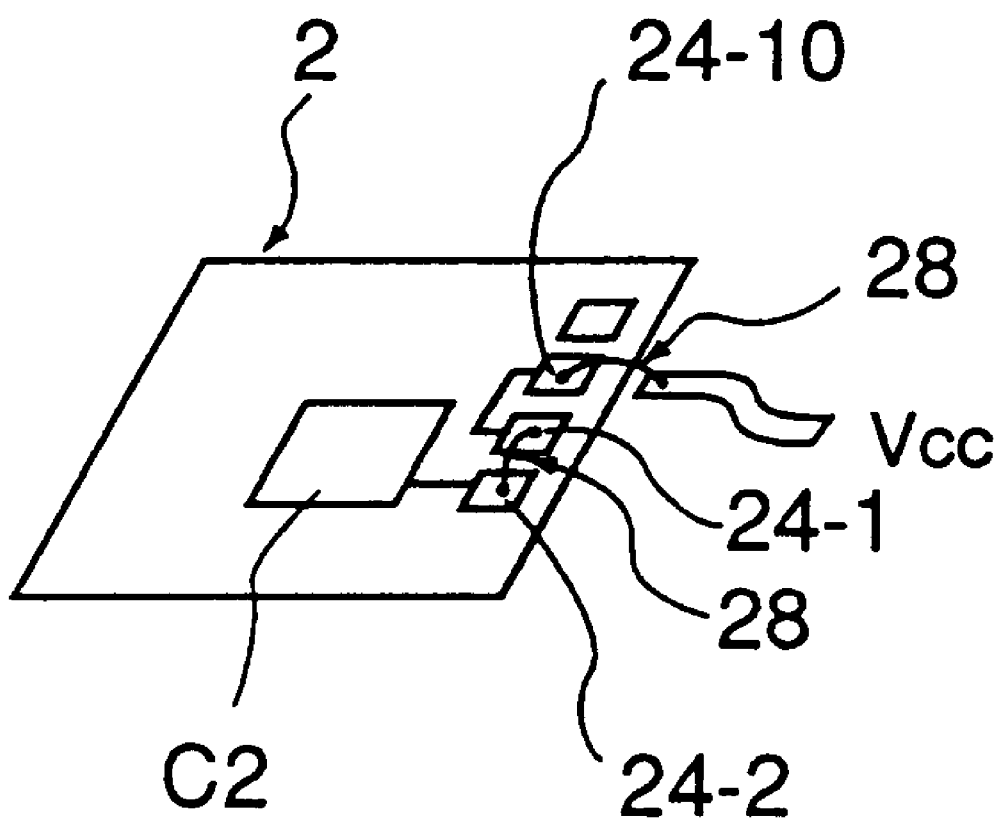
FIG. 24 is a perspective view showing an on-chip capacitor portion of the sixth embodiment on an enlarged scale.

Next, a description will be given of a sixth embodiment of the semiconductor device according to the present invention which employs a sixth embodiment of the power supply noise eliminating method according to the present invention. FIG. 24 shows the sixth embodiment of the semiconductor device. In FIG. 24, those parts which are the same as those corresponding parts in FIGS. 7 through 9 are designated by the same reference numerals, and a description thereof will be omitted.

In this embodiment, the impedance circuit 7 is provided within the semiconductor chip 2, that is, within the semiconductor integrated circuit 1. The semiconductor chip 2 includes electrodes 24-1 through 24-4, 24-10 and the like, and the electrodes 24-2 and 24-3 are coupled to each other via the impedance circuit 7. The capacitor C2 is realized by a on-chip capacitor, and the resistor R2 is realized by a general thin film resistor. FIG. 24 shows a perspective view of this on-chip capacitor portion on an enlarged scale. As shown in FIG. 24, the electrodes 24-10 and 24-1, the electrodes 24-1 and 24-2 and the like are connected via bonding wires 28. Accordingly, the connection of the semiconductor chip 2 and the impedance circuit 7 is realized at the electrode portions of the semiconductor chip 2 by wire-bonding.

Further, the present invention is not limited to these embodiments, but various variations and modifications may be made without departing from the scope of the present invention.

What is claimed is:

1. A power supply noise eliminating method which eliminates power supply noise in a semiconductor integrated circuit having at least one first terminal coupled to a first power supply voltage and at least one second terminal coupled to a second power supply voltage which is different than the first power supply voltage, said power supply noise eliminating method comprising the steps of:

(a) supplying the first power supply voltage to the at least one first terminal; and (b) supplying the second power supply voltage to another one of the at least one first terminal via an impedance circuit, thereby eliminating the power supply noise with respect to at least the first power supply voltage.

2. The power supply noise eliminating method as claimed in claim 1, wherein one of the first and second power supply voltages is ground.

3. The power supply noise eliminating method as claimed in claim 1, wherein the second power supply voltage is supplied by connecting said other one of the first terminals to one of the second terminals via the impedance circuit.

4. The power supply noise eliminating method as claimed in claim 2, wherein the second power supply voltage is supplied by connecting said another one of the at least one first terminal to the at least one second terminal via the impedance circuit.

5. The power supply noise eliminating method as claimed in claim 1, wherein the impedance circuit is coupled externally to the semiconductor integrated circuit.

6. The power supply noise eliminating method as claimed in claim 1, wherein the impedance circuit is provided within the semiconductor integrated circuit.

7. The power supply noise eliminating method as claimed in claim 1, wherein the impedance circuit is formed by a series circuit having at least one resistor and one capacitor coupled in series.

8. A semiconductor device, comprising:

a semiconductor integrated circuit comprising at least one first terminal receiving a first power supply voltage and at least one second terminal receiving a second power supply voltage different than the first power supply voltage; and an impedance circuit coupled between another one of the at least one first terminal and the second power supply voltage, so that power supply noise with respect to at least the first power supply voltage is eliminated.

9. The semiconductor device as claimed in claim 8, wherein one of said first and second power supply voltages is ground.

10. The semiconductor device as claimed in claim 8, wherein the at least one first terminal is coupled to the at least one second terminal via said impedance circuit.

11. The semiconductor device as claimed in claim 9, wherein the at least one first terminal is coupled to at least one second terminal via said impedance circuit.

12. The semiconductor device as claimed in claim 8, wherein said impedance circuit is coupled externally to said semiconductor integrated circuit.

13. The semiconductor device as claimed in claim 8, wherein said impedance circuit is provided within said semiconductor integrated circuit.

14. The semiconductor device as claimed in claim 8, wherein said impedance circuit comprises a series circuit including at least one resistor and one capacitor coupled in series.

15. The semiconductor device as claimed in claim 8, wherein said semiconductor integrated circuit comprises a semiconductor chip having a plurality of electrodes, and said semiconductor device further comprises bonding wires connecting at least one of the electrodes to one of the at least one first and second terminals and connecting said impedance circuit to at least one of the at least one first and second terminals.

* * * * *